United States Patent
Goetzke

(10) Patent No.: US 12,132,496 B2
(45) Date of Patent: Oct. 29, 2024

(54) NON-PLL, 1-WIRE, ASYNCHRONOUS OVERSAMPLING OF DELTA-SIGMA ADC BITSTREAM

(71) Applicant: TEXAS INSTRUMENTS INCORPORATED, Dallas, TX (US)

(72) Inventor: Luke Goetzke, Sahuarita, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 93 days.

(21) Appl. No.: 17/877,956

(22) Filed: Jul. 31, 2022

(65) Prior Publication Data
US 2024/0039551 A1    Feb. 1, 2024

(51) Int. Cl.
 H03M 3/00    (2006.01)
 G06F 7/499   (2006.01)
 H03M 1/12    (2006.01)

(52) U.S. Cl.
 CPC ........ H03M 1/125 (2013.01); G06F 7/49947 (2013.01); H03M 1/126 (2013.01)

(58) Field of Classification Search
 CPC ........ H03M 3/424; H03M 3/464; H03M 1/00; H03M 1/1038; H03M 1/504; H03M 1/361; H03M 1/822; H03M 3/43; H03M 3/498; H03M 3/506; H03M 1/06; H03M 1/0607; H03M 1/0626; H03M 1/10; H03M 1/1023; H03M 1/1061; H03M 1/12; H03M 1/1265; H03M 1/208; H03M 3/30; H03M 3/352; H03M 3/356; H03M 3/36; H03M 3/378; H03M 3/384; H03M 3/386; H03M 3/422; H03M 3/412; H03M 3/40; H03M 3/396; H03M 3/388; H03M 3/458; H03M 3/462; H03M 3/508

USPC .................................................... 341/61, 143
See application file for complete search history.

(56) References Cited

U.S. PATENT DOCUMENTS

| | | | | |
|---|---|---|---|---|
| 4,972,436 A | * | 11/1990 | Halim .................. | H03M 3/348 370/290 |
| 6,169,506 B1 | * | 1/2001 | Oprescu ................. | H03M 3/37 341/143 |
| 6,459,743 B1 | * | 10/2002 | Lipka ................. | H04L 27/2332 375/329 |

(Continued)

OTHER PUBLICATIONS

Texas Instruments Incorporated—How delta-sigma ADCs work, Part 1; Published Sep. 2016.

(Continued)

*Primary Examiner* — Linh V Nguyen
(74) *Attorney, Agent, or Firm* — John R. Pessetto; Frank D. Cimino

(57) ABSTRACT

A method and circuit for recovering data from a digital bitstream received from an analog to digital converter includes asynchronously oversampling the digital bitstream at a sampling rate dictated by an estimate of a clock rate of the analog to digital converter and a nominal oversampling factor. The method and circuit also includes calculating widths of bits of the digital bitstream, and calculating a learned oversampling factor using the calculated widths of a predetermined number of bits of the digital bitstream and a minimization function. The method and circuit also includes calculating data bits to be inserted to a digital filter for digestion using the calculated widths of the bits of the digital bitstream and the learned oversampling factor.

20 Claims, 12 Drawing Sheets

(56) References Cited

U.S. PATENT DOCUMENTS

| | | | | |
|---|---|---|---|---|
| 6,639,526 B1 * | 10/2003 | Mayes | H03M 3/498 | 341/61 |
| 7,068,197 B1 * | 6/2006 | Tsyrganovich | H03M 3/344 | 341/143 |
| 7,167,118 B1 * | 1/2007 | Melanson | H03M 3/506 | 341/143 |
| 7,209,067 B1 * | 4/2007 | Melanson | H03M 7/3013 | 341/143 |
| 7,576,671 B2 * | 8/2009 | Petilli | H03M 1/0663 | 341/143 |
| 7,656,932 B2 * | 2/2010 | Durand | H04B 1/7093 | 375/144 |
| 7,873,097 B1 * | 1/2011 | Luecke | H04B 1/707 | 375/147 |
| 8,625,726 B2 * | 1/2014 | Kuan | H04B 1/0021 | 375/247 |
| 9,031,171 B2 * | 5/2015 | Smail | H03D 7/161 | 375/350 |
| 9,094,033 B1 * | 7/2015 | Lye | H03M 1/68 | |
| 10,554,215 B1 * | 2/2020 | McGibney | H03M 1/0626 | |
| 11,050,435 B1 * | 6/2021 | Poulsen | H03M 3/414 | |
| 2002/0019962 A1 * | 2/2002 | Roberts | G01R 31/3167 | 714/724 |
| 2003/0107507 A1 * | 6/2003 | Wang | H03M 3/50 | 341/143 |
| 2004/0252038 A1 * | 12/2004 | Robinson | H03M 3/50 | 341/143 |
| 2007/0146185 A1 * | 6/2007 | Kang | H03H 17/0416 | 341/143 |
| 2008/0165043 A1 * | 7/2008 | Wiesbauer | H03M 3/484 | 341/143 |
| 2023/0361784 A1 * | 11/2023 | Maurino | H03M 3/356 | |

OTHER PUBLICATIONS

Texas Instruments Incorporated—How delta-sigma ADCs work, Part 2; Published Sep. 2016.

* cited by examiner

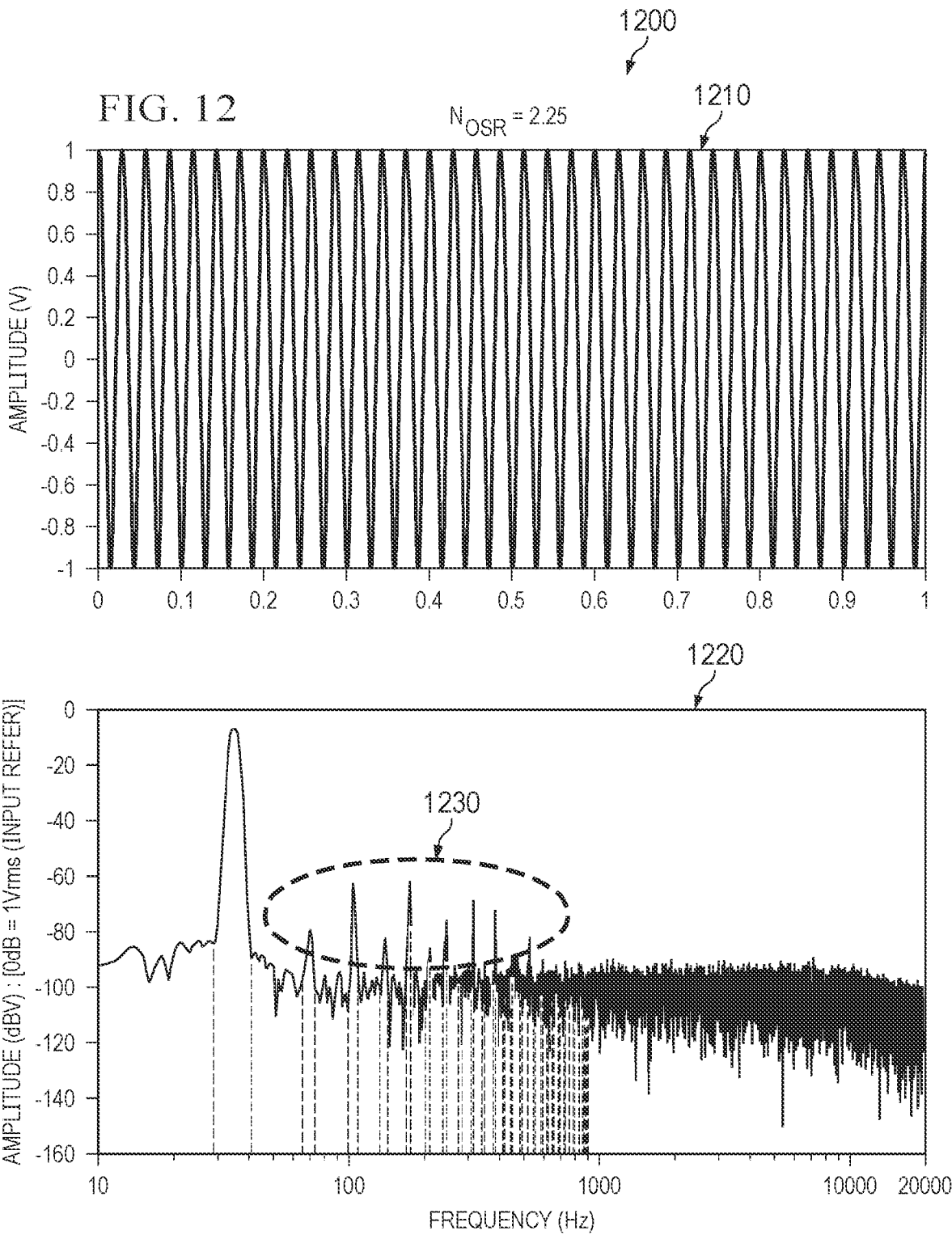

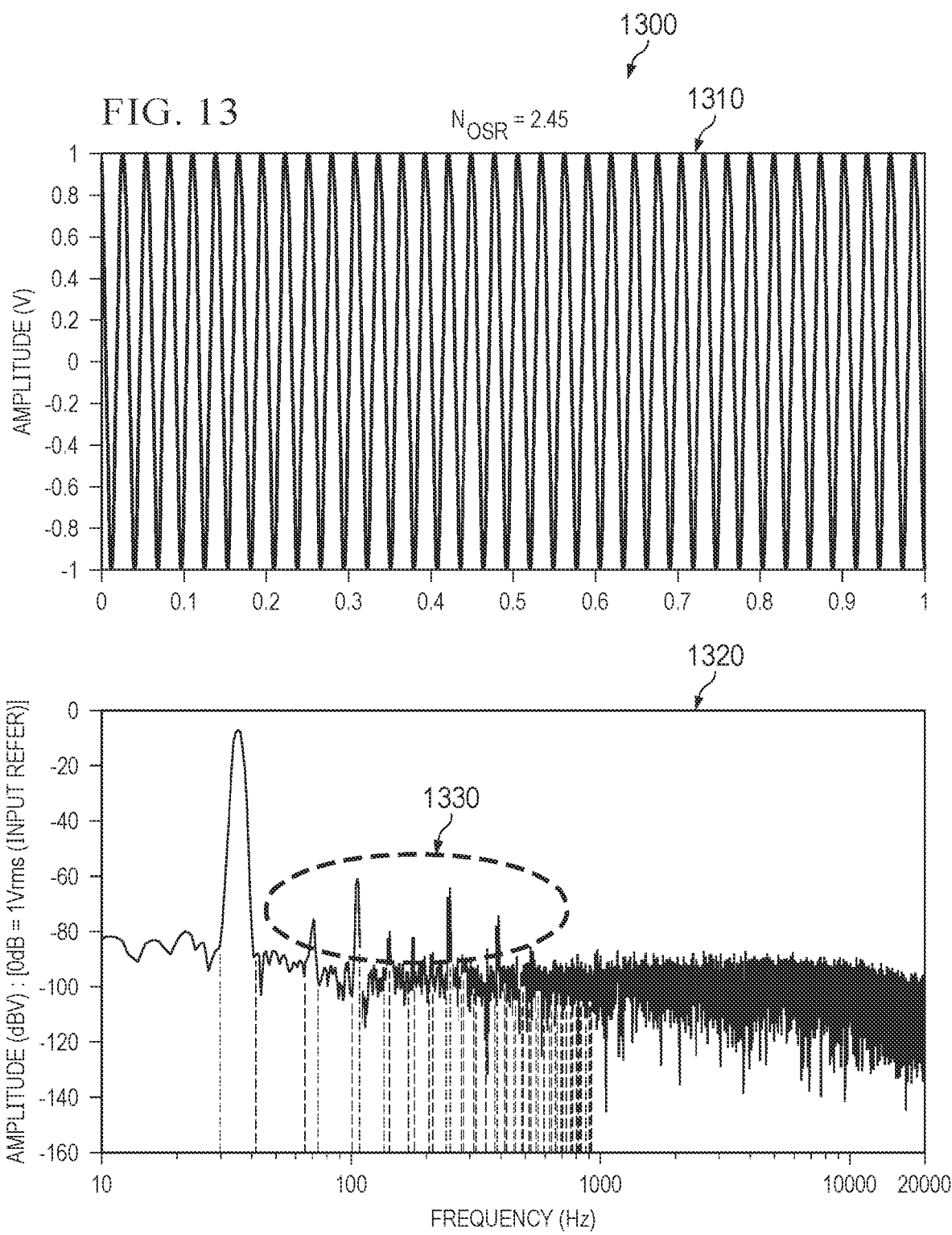

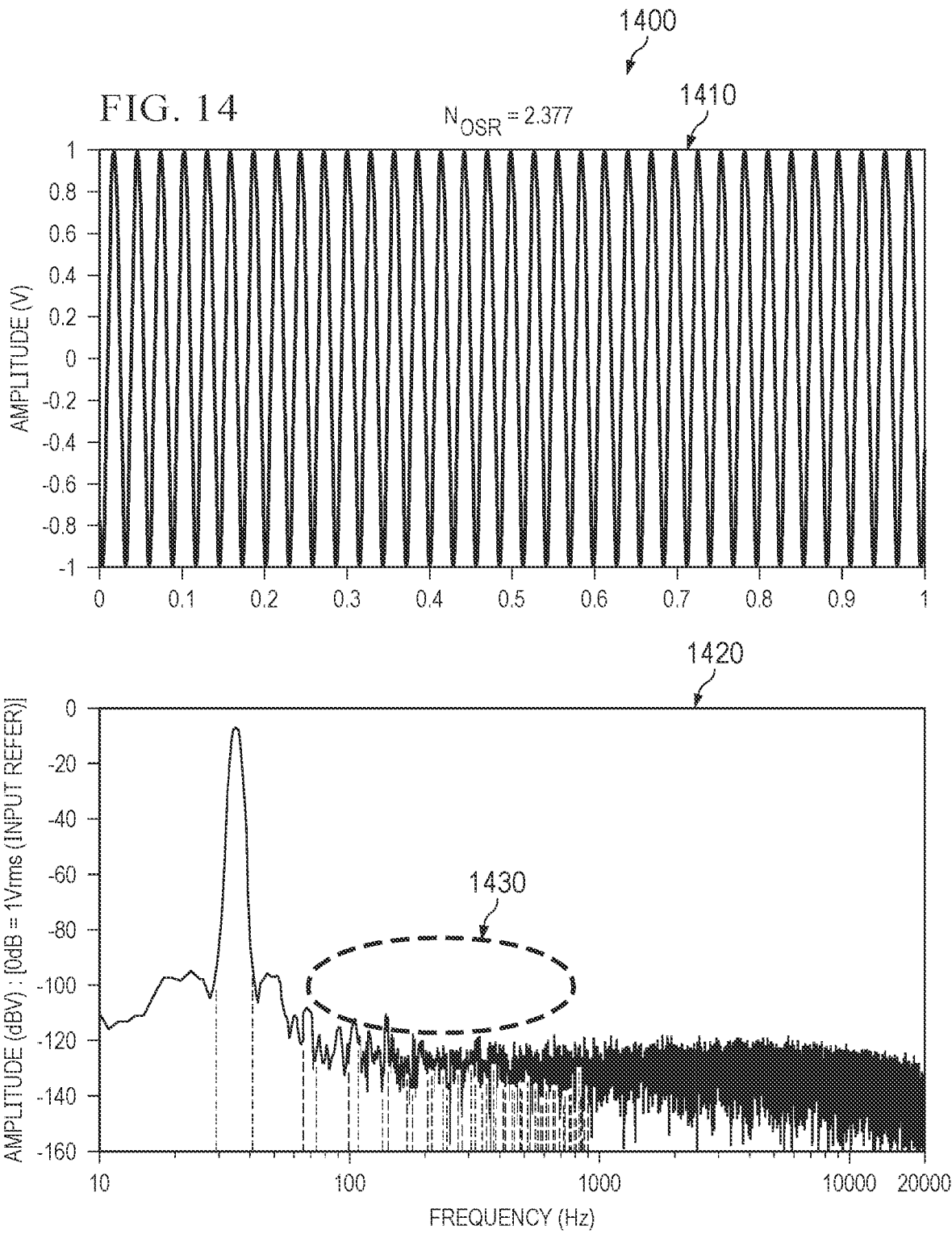

```
// Asynchronous oversampling of DOUT modulator bitstream at 2^Y target rate
always @ negedge( Async_NOSR_clock )
begin
    DOUT_n1 <= DOUT; // current DOUT bitstream sample          ← 1510
    DOUT_n2 <= DOUT_n1; // previous DOUT bitstream sample if(DOUT_n1 == DOUT_n2) // bitstream state has not changed   ← 1520
    begin
        bitstate <= DOUT_n1; // update bitstate to latest       ← 1530
        width_cntr <= width_cntr + 1; // 2^Y width counter, overflow triggers a bit
        trig_rnd_bit <= 0; // no [Y-1] rounding trigger
    end
    else // bitstream state changed          ← 1540
    begin
        bitstate <= bitstate;
        width_cntr <= 0; // reset the width counter
        trig_rnd_bit <= width_cntr[Y-1]; // [Y-1] rounding trigger for extra bit
    end
end                                  1550

// Add 1 bit to the modulator bitstream digestion
// 1: triggered by overflow of 2^Y width counter
// 2: triggered by DOUT state change, and the [Y-1] counter position
always @ posedge( width_cntr_carryOverflow OR trig_rnd_bit )
begin
    Bit_to_Insert <= bitstate;
    // Insert digital filter (SINC/OSR)
end
```

FIG. 15

NON-PLL, 1-WIRE, ASYNCHRONOUS OVERSAMPLING OF DELTA-SIGMA ADC BITSTREAM

BACKGROUND

Most electronic interfaces with the world are based on analog signals (for example, most sensors output an analog signal and signals are transmitted via an analog signal modulated by digital data) while most signal processing is accomplished digitally. In order to process an analog signal using a digital processor, analog-to-digital converters (ADC) may be used. To implement an ADC, both analog circuitry and digital circuitry are needed. For example, a delta-sigma ADC is comprised of approximately three-quarters digital circuity and one-quarter analog circuitry.

SUMMARY

In one example of the disclosure, a method and system of recovering a non-encoded digital bitstream is provided. Such method and system employs an asynchronous oversampling of the received non-encoded digital bitstream, and such asynchronous oversampling is utilized to calculate widths of the digital values of the bitstream, that is the width of each "1" and "0" value received at a controller circuit. Using the calculated widths of a subset of bits of the received digital bitstream, a range of oversampling factors are subjected to a minimization function to learn the optimal oversampling factor that satisfies the minimization function and thus accurately reflects the actual clock rate of the circuitry that generated that non-encoded digital bitstream. The learned oversampling factor is then employed with the calculated widths of the non-encoded digital bitstream to insert the bits accurately to a digital filter digestion operation. In the above manner, the data of the non-encoded digital bitstream is accurately recovered despite not being provided clock information from the circuitry that generated such bitstream, thereby reducing layout complexity issues relating to additional transmission paths for clock information. In addition, the single transmission line solution per ADC exists without the need for Manchester encoding of the digital bitstream, thus allowing for an oversampling of the digital bitstream at a lower oversampling rate. Lastly, no phase locked loop (PLL) circuitry is necessary to phase lock the non-encoded digital bitstream from the ADC to the control circuitry that performs the oversampling and recovers the data.

In one example, a method for recovering data from a digital bitstream received from an analog to digital converter is disclosed. Such method comprises asynchronously oversampling the digital bitstream at a sampling rate dictated by an estimate of a clock rate of the analog to digital converter and a nominal oversampling factor, and calculating widths of bits of the digital bitstream, wherein the widths of the bits correspond to a number of cycles of the asynchronous oversampling rate of the bits as "0s" and "1s" of the digital bitstream. The method further comprises calculating a learned oversampling factor using the calculated widths of a predetermined number of bits of the digital bitstream and a minimization function, and calculating data bits to be inserted to a digital filter for digestion using the calculated widths of the bits of the digital bitstream and the learned oversampling factor.

In one example, a controller circuit is disclosed that is configured to receive a non-encoded digital bitstream. The controller circuit comprises a memory circuit configured to store data associated with the received non-encoded digital bitstream and control circuit operably coupled to the memory circuit. The control circuit is configured to asynchronously oversample the received non-encoded digital bitstream at a sampling rate that is related to an estimate of a clock rate of the circuitry that generated the non-encoded digital bitstream, for example, a delta-sigma analog to digital converter. The control circuit is also configured to calculate widths of bits of the received non-encoded digital bitstream (such widths correspond to a number of cycles of the sampling rate of the asynchronous oversampling of the bits), and save the calculated widths in the memory circuit. The control circuit is further configured to calculate a learned oversampling factor by using the calculated widths of a predetermined number of bits of the non-encoded digital bitstream and a minimization function. The control circuit is also configured to employ the calculated learned oversampling factor to calculate the bits for insertion to a digital filter for digestion.

In another example, a method for recovering data from a digital bitstream received from an analog to digital converter comprises asynchronously oversampling the received digital bitstream at a sampling rate $2^Y$ using a Y-bit-width counter. The method further comprises comparing a value of a sample at a count "i" of the counter to a value of a sample at a previous count, and continuing an oversampling of the received digital bitstream when the value of the received digital bitstream is the same as the value of the received digital bitstream at the previous count. The method comprises continuing the comparing if the sample value condition continues to be the same until the counter overflows, at which point a bit having the value as a first digital value is inserted to a digital filter. The method further comprises evaluating a most significant bit (MSB) of the counter count when the value of the received digital bitstream at the present sample is not the same as the value of the received digital bitstream at the previous sample, thereby indicating a transition in state of the received digital bitstream to a second, different digital value. A bit having the value as the first digital value is inserted to the digital filter when the MSB of the counter count is a value of "1" indicating a rounding up of a rounding function, and no bit insertion occurs when the MSB is a value of "0," indicating a rounding down of the rounding function.

BRIEF DESCRIPTION OF THE DRAWINGS

FIG. 12 shows a time domain signal and a frequency domain signal of a recovered bitstream employing an oversampling factor that does not satisfy the minimization function according to one example.

FIG. 13 shows a time domain signal and a frequency domain signal of a recovered bitstream employing an oversampling factor that does not satisfy the minimization function according to one example.

FIG. 14 shows a time domain signal and a frequency domain signal of a recovered bitstream employing an oversampling factor that does satisfy the minimization function according to one example.

FIG. 15 is a pseudocode VERILOG program listing showing a simplified method of recovering a non-encoded digital bitstream using asynchronous oversampling according to one example.

The same reference numbers or other reference designators are used in the drawings to designate the same or similar (functionally and/or structurally) features.

DETAILED DESCRIPTION

Delta-sigma ADCs are popular circuit solutions for converting analog signals over a wide range of frequencies, from DC up to several megahertz. Such ADCs comprise, typically, an oversampling modulator that feeds a digital/decimation filter block that, together, generate a high-resolution digital data stream output, or bitstream.

Figure 1:
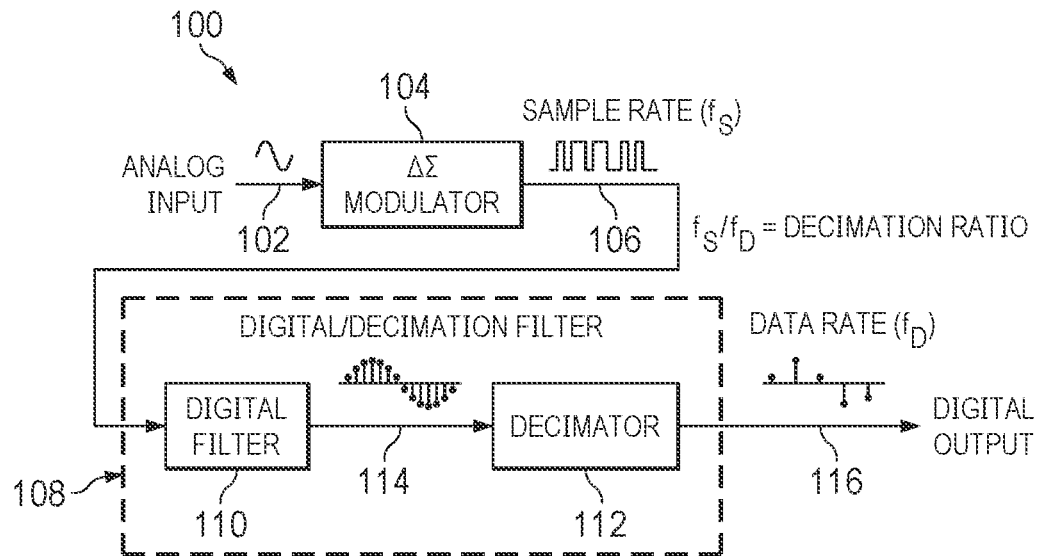
FIG. 1 is a block diagram illustrating a delta-sigma analog-to-digital converter (ADC) according to one example.

As shown in FIG. 1, a block diagram of a delta-sigma converter 100, according to one example, receives an analog input signal 102, and provides such analog input signal to a modulator circuit block 104 that converts the analog signal 102 to a digital modulator output signal 106. The modulator circuit block 104 output is provided, as an input, to a digital/decimation filter circuit block 108 composed of a digital filter circuit 110 and a decimator circuit 112. The digital modulator output signal 106 is input to the digital filter circuit 110 that generates a filtered digital modulator output signal 114, and the filtered signal 114 is decimated or otherwise processed by the decimation circuit 112 to form a digital output signal 116 that is the delta-sigma ADC digital output bitstream that represents, digitally, the analog input signal 102.

The modulator circuit block 104 operates to digitize the analog input signal 102, and operates to reduce noise at lower frequencies. In one example, the circuitry performs noise shaping that shifts low frequency noise up to higher frequencies where it is outside the frequency band of interest, wherein the unwanted noise can be filtered and removed relatively easily. The noise shaping functionality is one feature that makes delta-sigma modulators popular for low frequency, high accuracy measurements.

Figure 2:
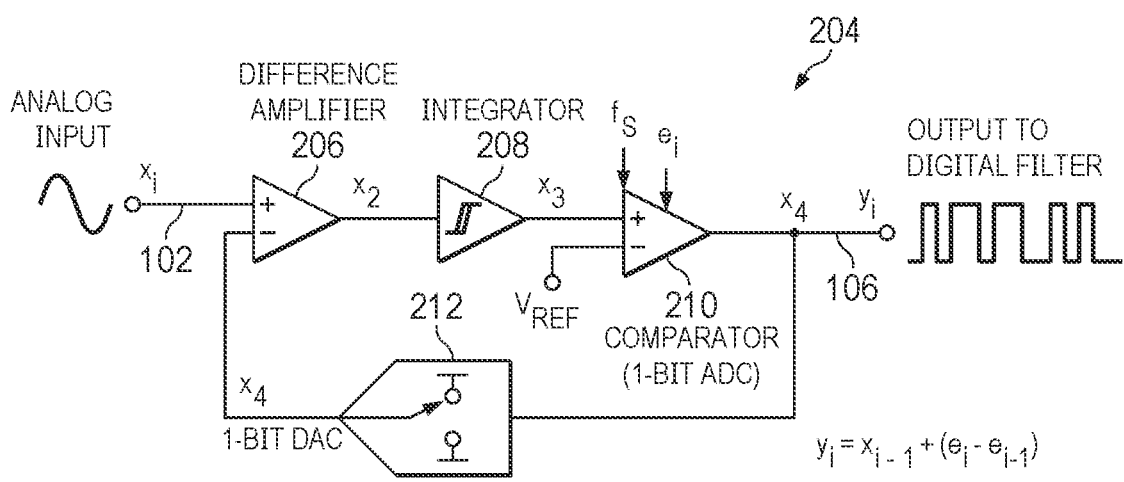
FIG. 2 is a block diagram illustrating components of a delta-sigma modulator portion of a delta-sigma ADC according to one example.

FIG. 2 is a simplified block diagram of a first-order delta-sigma modulator circuit 204, according to one example, that operates to sample the analog input signal to generate a stream of 1-bit codes; that is, a raw bitstream of digital values where the ratio of the number of "1s" to the number of "0s" (sometimes called the bitstream density) represents the analog input signal value. The modulator 204, in this particular example, includes a difference amplifier 206, an integrator 208, a comparator 210, and a 1-bit digital-to-analog converter 212. Modulator circuit 204 may, in some examples, be utilized to implement modulator 104 of FIG. 1.

Referring to operation in the time domain, the analog signal 102 at $x_1$ and the output of the digital-to-analog converter (DAC) 212 at $x_4$ are differentiated at the difference amplifier 206 to provide a differentiated analog voltage at $x_2$. The analog differentiated voltage at $x_2$ is input to the integrator circuit 208 and is integrated, resulting at $x_3$ with an integrated analog signal, wherein the slope and direction of the integrated analog signal at $x_3$ is dictated by the sign and magnitude of the voltage at $x_2$. When the integrated analog voltage signal at $x_3$ equals the reference voltage $V_{REF}$ of the comparator circuit 210, the output of the comparator circuit switches from low-to-high or from high-to-low, respectively. In this way, the comparator circuit 210 operates as a 1-bit ADC. The digital output signal 106 at $x_4$ is fed back into the DAC 212 and is output, or "clocked out," to the digital filter circuit (e.g., circuit 110) of FIG. 1. When the output of the comparator circuit 210 switches its state, the 1-bit DAC 212 responds by altering or switching the analog output voltage of the difference amplifier 206. This alters the voltage at $x_2$, causing the integrator circuit 208 to output a voltage that moves in the opposite direction. Thus, the resultant digital output signal 106 (i.e., the raw bitstream) is a pulse-wave representation of the analog input signal 102 at a sampling rate $f_s$, which is the frequency of the clock that drives the comparator circuit 210.

In the time domain, the 1-bit ADC (e.g., the comparator circuit 210) digitizes the analog signal at $x_3$ to a coarse, 1-bit output code at $x_4$ that produces quantization noise. Thus, the output 106 of the delta-sigma modulator circuit block 104 is equal to the input plus the quantization noise: $[(e_i)-(e_{i-1})]$. More particularly, based on the time-domain transfer function, the quantization noise is the difference between the current quantization error $(e_i)$ and the previous quantization error $(e_{i-1})$. The location of this quantization noise is shifted to higher frequencies. Therefore, the combination of the integrator circuit 208 and the sampling strategy implements a noise-shaping filter on the digital output code 116.

Figure 3:
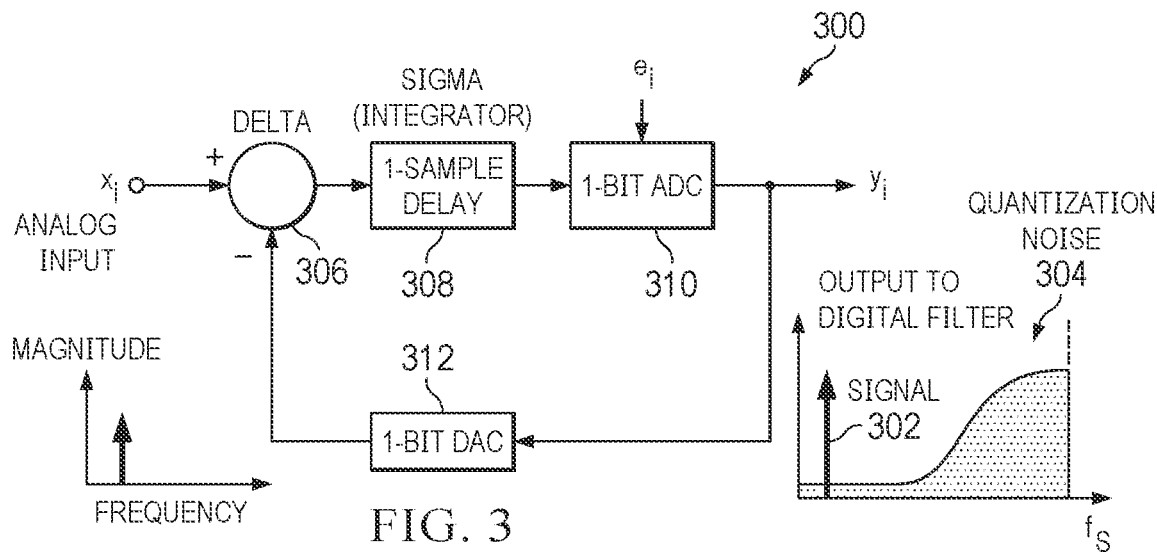
FIG. 3 is a block diagram illustrating frequency domain components of the modulator portion of a delta-sigma ADC according to one example.

The modulator 204 of FIG. 2 manipulates/process signals in a discrete time domain representation. Circuitry 300 in FIG. 3 manipulates/processes signals (e.g., the same signals received by modulator 204) in a discrete time domain. As such, the elements 306, 308, 310 and 312 correspond to the corresponding time domain elements 206, 208, 210 and 212 of FIG. 2, respectively. In the frequency domain, the discrete time-domain output pulses appears as two components: the input signal spur 302 and the shaped noise 304, as shown in the graph portion of FIG. 3. As illustrated, a significant portion of the quantization noise 304 is moved or shifted out to higher frequencies. The graph in FIG. 3 shows the quantization noise for a first-order delta-sigma modulator to start low at zero Hertz, rise rapidly, and then level out at a maximum value at the modulator's sampling frequency.

Further noise shaping can be performed with higher order modulator by incorporating additional integrators. This results in a further reduction of in-band quantization noise at the lower frequency range of interest. In such cases, the quantization error noise term depends not only on the previous error, but on multiple previous errors. Therefore, in summary, multiple order modulators shape the quantization noise further to high frequencies (e.g., near the sampling rate $f_s$). However, at low frequencies (e.g., around the output data rate ($f_D$) and near the input signal spur) the modulator is has less noise.

Figure 4:
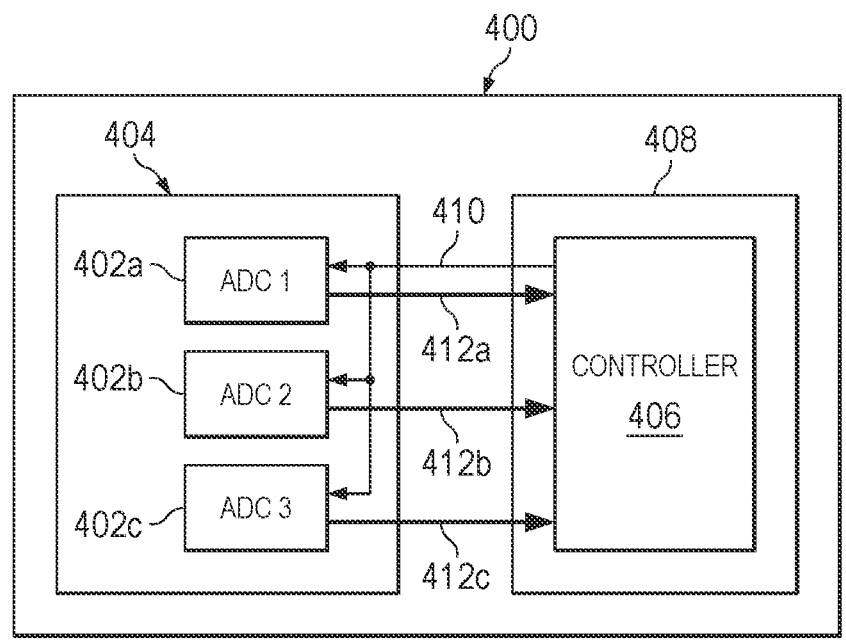
FIG. 4 is a bock diagram illustrating ADCs interfacing with a host controller employing an external host-based clock according to one example.

In FIG. 1, the delta sigma ADC 100 includes both the modulator portion 104 (that produces the raw digital bitstream 106) as well as the back end processing (such as the digital filter 110 and the decimator 112). In some examples, as illustrated in FIG. 4, system 400 includes multiple ADCs (such as ADCs 402a, 402b and 402c), and a host or controller circuit 406, that provides the back end processing (such as filtering, decimation, etc.) which may be referred to as digital digestion. In some examples, one or more of ADCs 402a-402c may be implemented by ADC 100 of FIG. 1, and controller 406 may be implemented using any type of processor, digital circuitry, analog circuitry, memory, state machine and/or software. One or more of the ADCs 402a-402c may be included in an integrated circuit (such as integrated circuit 404), and controller 406 may be implemented on a different integrated circuit 408. In other examples, ADCs 402a-402c and/or controller 406 may be implemented in more or less integrated circuits. In some examples, more or fewer ADCs may be included in circuitry 404, and a corresponding number of data connections and/or clock connections may be provided to the ADCs. In one solution, the controller chip clock 410 is provided to each of the ADCs 402a-402c in order to synchronize (e.g., with the controller 406) the raw digital data 412a, 412b and 412c from each of the ADCs. However, providing the controller clock 410 to each of the ADCs 402a-402c may require an extra connection (e.g., an extra pin if each ADC is implemented in a separate integrated circuit) for each of the ADCs and the controller chip 408. In these examples, the circuitry may still encounter potential timing violations such as setup and hold timing type violations that can be sensitive to layout trace length and buffer delays.

Figure 5:
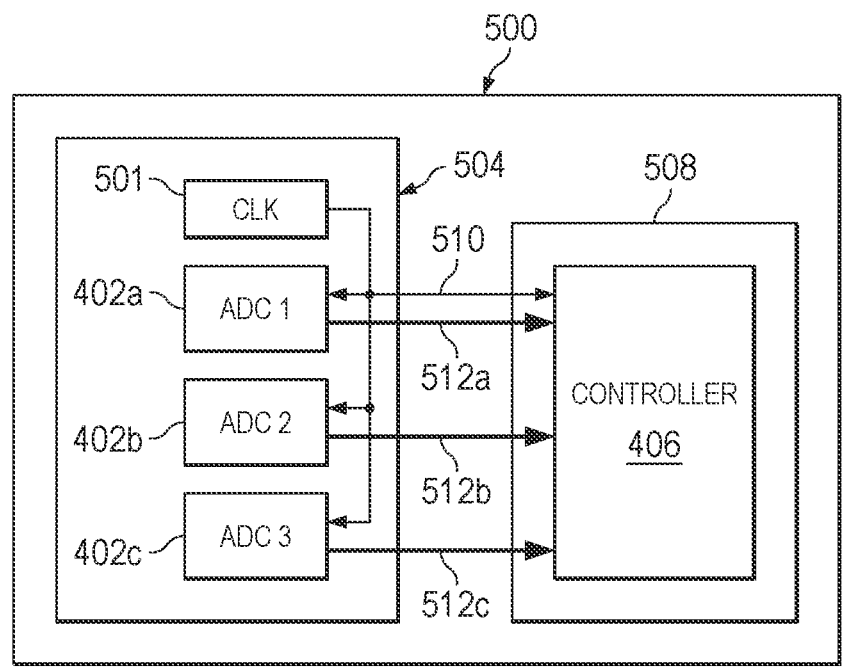
FIG. 5 is a block diagram illustrating ADCs interfacing with a host controller employing an external ADC-based clock according to one example.

An alternative system 500 is illustrated in FIG. 5, and shows an external clock 501 resident on the measurement side 504 containing the ADCs 402a-402c. The clock 501 is connected to each of the ADCs 402a-402c to provide clock signal 510 to each of the ADCs 402a-402c. In addition, clock signal 510 may be provided to integrated circuit 508 (which may include controller 406) in order to properly recover the raw bitstream (e.g., digital data) on the data lines 512a-512c. This solution also requires an extra clock connection (such as a pin if ADCs 402a, 402b and/or 402c, clock source 501 and/or controller 406 are implemented as separate integrated circuits/packaged semiconductor devices) to each of the ADCs 402a-402c and integrated circuit 508 and results in a total of four transmission lines between the various chips.

Figure 6:
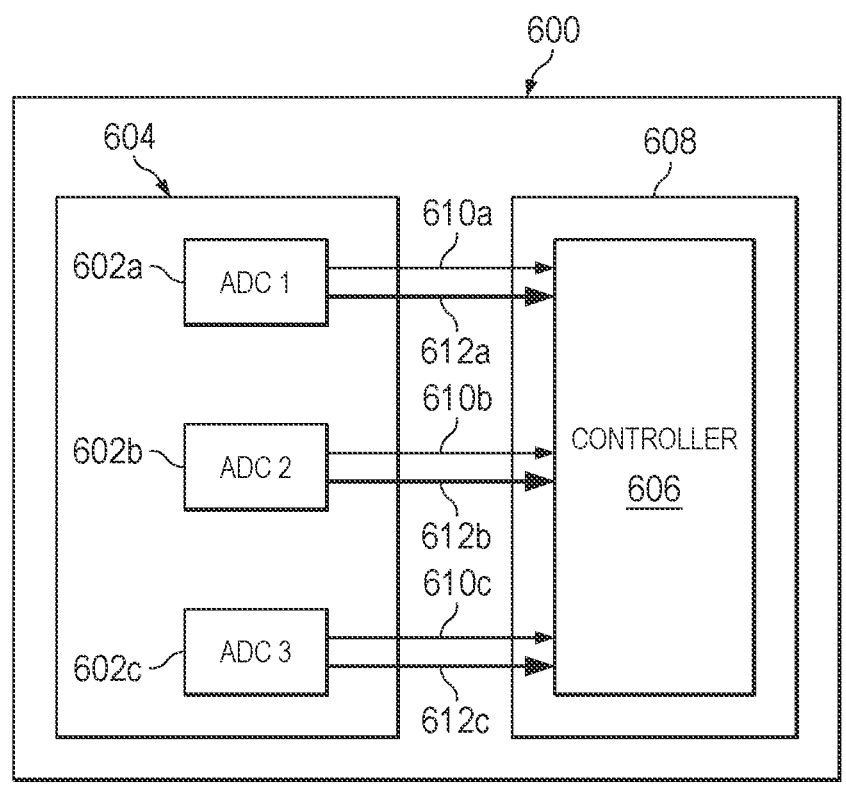
FIG. 6 is a block diagram illustrating ADCs interfacing with a host controller with each ADC employing and conveying an internal clock according to one example.

Another solution is illustrated in FIG. 6. ADCs 602a, 602b and 602c may include an internal clock and may be implemented using ADC 100 shown in FIG. 1 (in addition to internal clock circuitry). In this type of solution, each data line 612a, 612b and 612c is synchronous with its respective clock connection 610a, 610b and 610c, but may not be synchronous with one another. Such a solution requires the host controller 606 to receive each clock 610a-610c and each data line 612a-612c to recover the respective raw bitstream data. This solution requires separate clock connections (to controller 606) for each ADC 602a-602c in addition to the separate data connections. Hence, there are six transmission paths therebetween.

Figure 7:
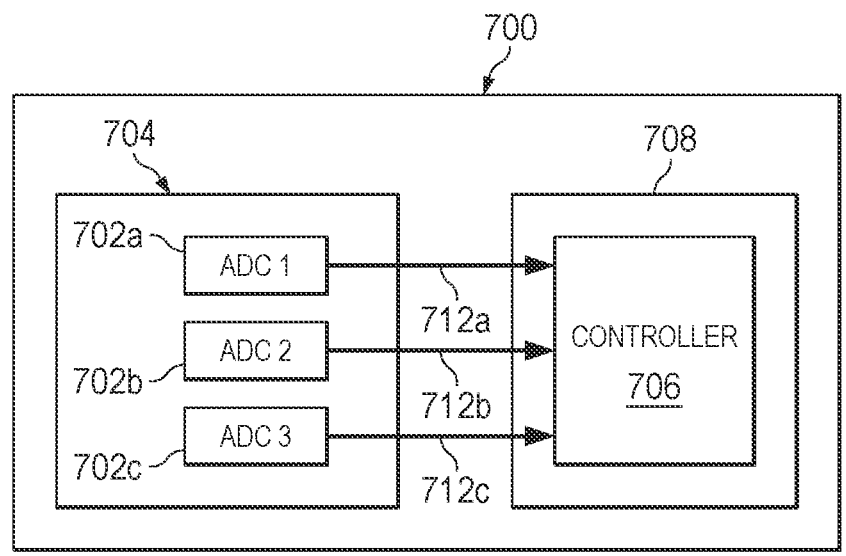
FIG. 7 is a block diagram illustrating ADCs interfacing with a host controller using a single-wire data line and no clock transmission path(s) according to one example.

FIG. 7 shows a system 700 according to one example of the present disclosure. The system 700 uses multiple ADCs (such as ADCs 702a, 702b and 702c—each may be implemented using any portion of ADC 100 illustrated in FIG. 1) on a measurement side 704 of the system, and a controller 706 on a second side of the system. ADCs 702a, 702b and/or 702c and/or controller 706 may be implemented as one or more integrated circuits. The controller 706 contains circuitry that is configured to receive the raw digital bitstreams on the various data lines 712a, 712b and 712c from the ADCs 702a-702c, respectively. The controller 706 receives the bitstreams and performs an asynchronous oversampling thereof. Based on such oversampling, widths of the bits of the raw, digital bitstreams are measured and subjected to a minimization function to ascertain an oversampling factor that reflects the actual clock frequencies of the ADCs 702a-702c employed in generating the respective data bitstreams. Upon determination of such oversampling factor, the controller 706 utilizes such factor in recovering the data in the bitstreams. Due to the asynchronous nature of the oversampling performed at the controller 706, no clock information (such as clock signals) needs to be transmitted between the ADCs 702a-702c and the controller 706. Thus, in a system such as system 700 of FIG. 7, if "n" ADCs 702a-702n output their respective bitstreams 712-702n to a single controller 706, only "n" transmission paths are needed between the ADCs 702a-702n and controller 706, as no external connections are needed to convey clock information, and no additional transmission paths are needed to carry the one or more clocks as in previously-discussed solutions.

Figure 8:
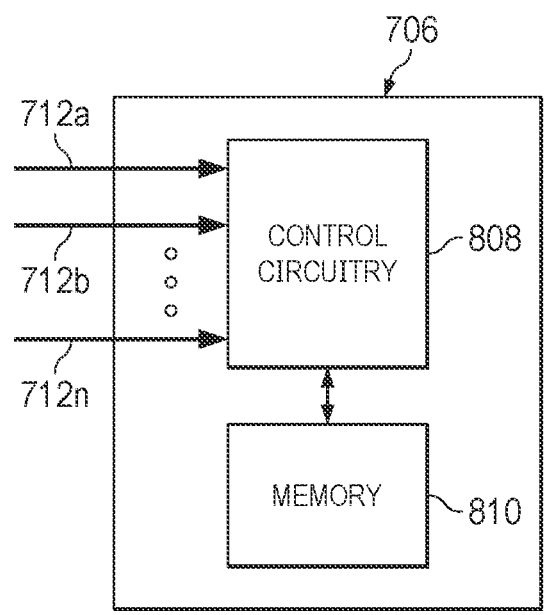
FIG. 8 is a block diagram illustrating a host controller circuit for receiving a digital bitstream from one or more ADCs according to one example.

FIG. 8 illustrates a host or controller circuit 706 that resides on a host/controller integrated circuit chip, such as a chip 708 illustrated in FIG. 7. The controller circuit 706 includes control circuitry 808 (including, for example, one or more processors, digital circuitry, analog circuitry, memory, state machine and/or software), that is operably coupled to memory circuitry 810 (for example, non-transitory memory). Controller circuitry 808 and memory 810 may be implemented on one or more integrated circuits. The controller circuit 706 receives, inter alia, one or more digital bitstreams 712a-712n, depending on the number of ADCs with which it is operating. While in the examples that follow below, the functionality of the controller circuit 706 will be discussed in conjunction with one digital bitstream, such functionality may be performed with a plurality of such bitstreams, and such variations are contemplated as falling within the scope of the disclosure. As will be more fully appreciated, the digital bitstreams are non-encoded bitstreams, as they do not need to have clock information encoded therein, such as Manchester encoding.

Figure 9:
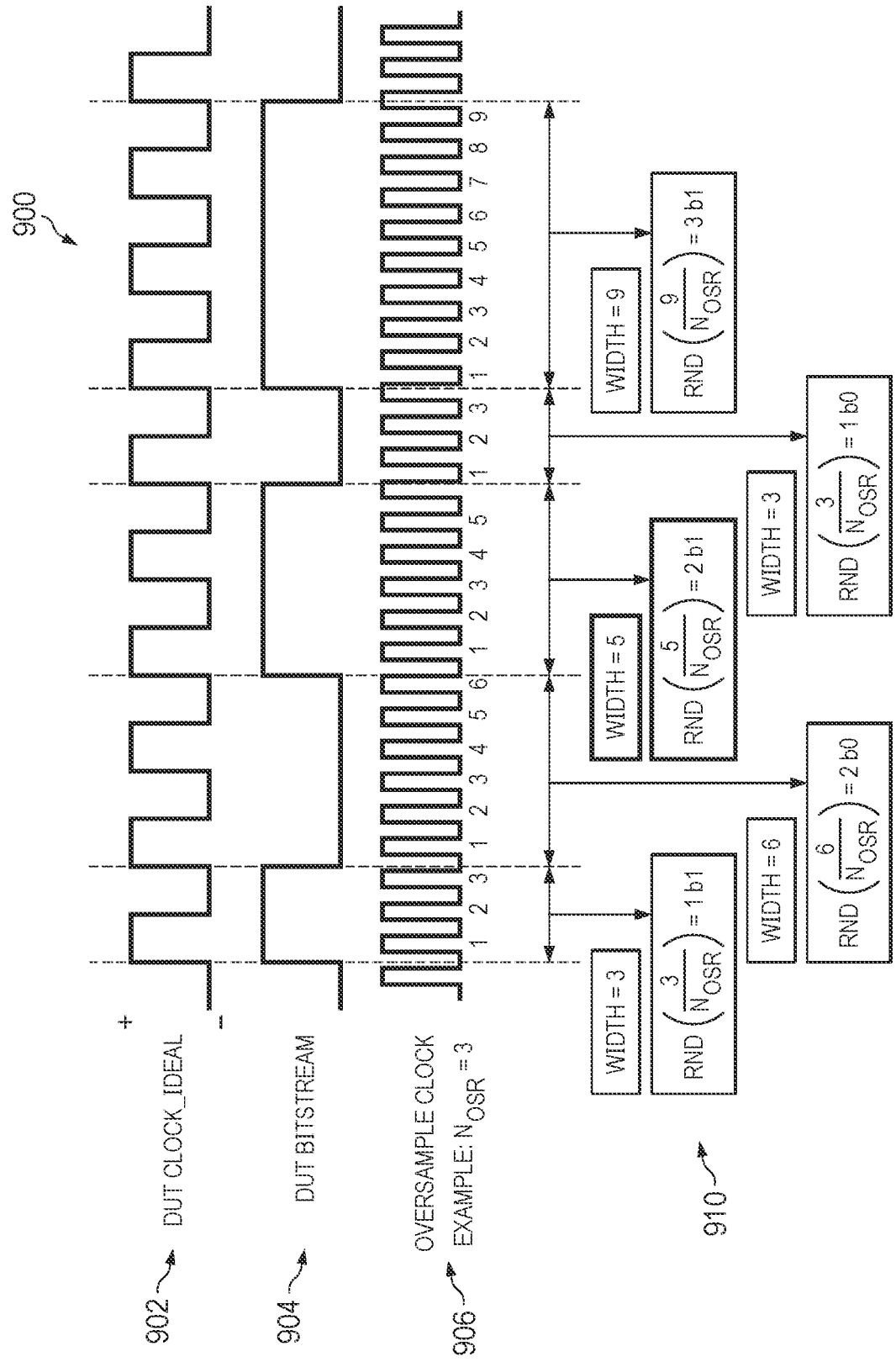
FIG. 9 illustrates multiple signal waveforms illustrating various aspects of asynchronously sampling the digital bitstream according to one example.
Figure 10:
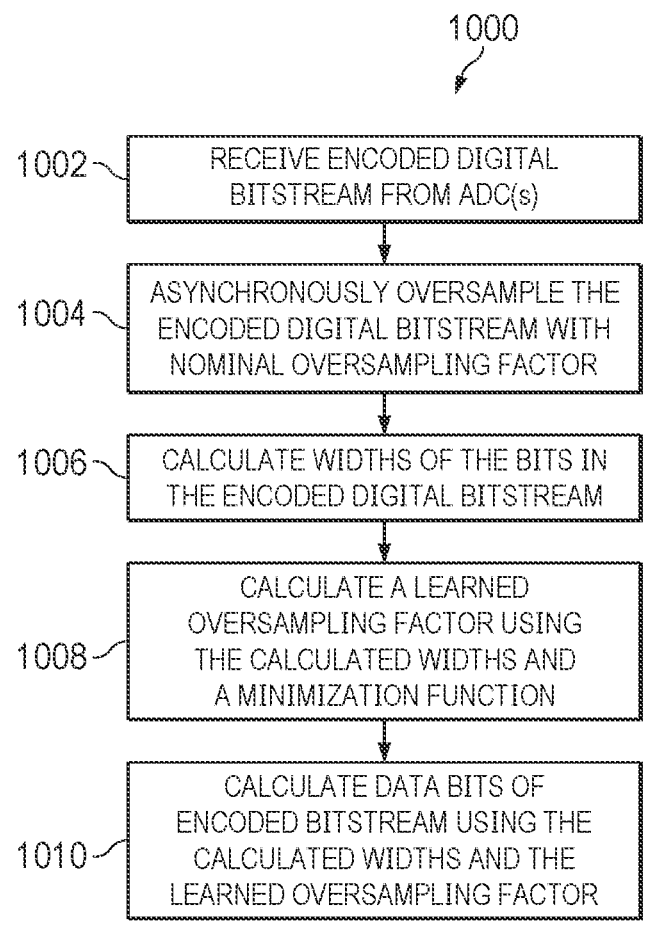
FIG. 10 is a flow chart diagram illustrating a method of recovering data from a digital bitstream received from an ADC according to one example.

The operation of the controller circuit 706 will be discussed in conjunction with the signal diagrams shown in FIG. 9 and the flow chart of FIG. 10. As discussed supra, each ADC (such as ADCs 702a-702c) operates at a clock rate that is known in a general sense to the controller circuit 706, but the actual clock rate of each ADC is not known. For example, the data sheet on the ADC chip may state that the ADC clock is specified to run at 10 MHz, but the actual clock rate may be, for example, as much as +/−10% of that rate. Thus, the actual clock rate of the device under test (DUT, i.e., the ADC clock) 902 may be anywhere from 9 MHz to 11 MHz. It is this actual DUT clock rate at which the digital bitstream, labelled the DUT bitstream 904 in FIG. 9, is received at the controller circuit 706. Referring to FIG. 10, the method 1000 comprises receiving the digital bitstream (such as digital bitstream 904) at the controller (such as controller 706 of FIG. 7) at 1002, wherein the data rate of the digital bitstream 904 is dictated by the unknown clock rate of the DUT or ADC clock 902. At 1004, the controller circuit 706 asynchronously oversamples the digital bitstream with an oversampling clock. The oversampling factor $N_{OSR}$ of the oversampling clock 906 at the controller circuit 706 in FIG. 9 is illustrated to be three (3), because in this example it is easy to illustrate with the signals 902 and 904, however, it should be understood that this initial oversampling factor for the clock can be set to another value and such alternatives are contemplated by the present disclosure. This $N_{OSR}$ is called herein the nominal oversampling factor, and it is with this oversampling clock (DUT $CLK_{estimated}*N_{OSR}$) 906 that the width of the "1s" and "0s" in the digital bitstream 904 are calculated by the controller circuit 706 at 1006 of FIG. 10. The control circuitry 808 of FIG. 8 saves the widths of all the "1s" and "0s" of the digital bitstream 904 as data points in the memory 810 of the controller circuit 706.

Referring to FIG. 10, at 1008 a learned oversampling factor is calculated using some subset of the calculated widths saved in the memory 810, using a minimization function. In one example, a first 1,000 data points (e.g., calculated widths) are used to find, or calculate, an $N_{OSR}$ to satisfy a minimization function, such as:

$$0 = \sum_{i=0}^{1000} \left( \frac{\left(\frac{\text{width}[i]}{N_{OSR}}\right)}{RND\left(\frac{\text{width}[i]}{N_{OSR}}\right)} - 1 \right)$$

Thus, the control circuitry varies or adjusts $N_{OSR}$ over a range of values, for example, between the values $2.0 < N_{OSR} < 3.0$, to find the $N_{OSR}$ value that best satisfies the minimization function. It is this adjusted or "learned" $N_{OSR}$ factor that best reflects the actual DUT clock frequency 902 and thus the actual data rate of the DUT bitstream 904. Therefore, relative to the clock domain at the controller 806 of FIG. 8 (which is the oversampling clock 906 domain), the DUT clock frequency 902 (i.e., the DUT clock rate) becomes interpreted as CLK_oversampling/$N_{OSR}$(learned).

Figure 11:
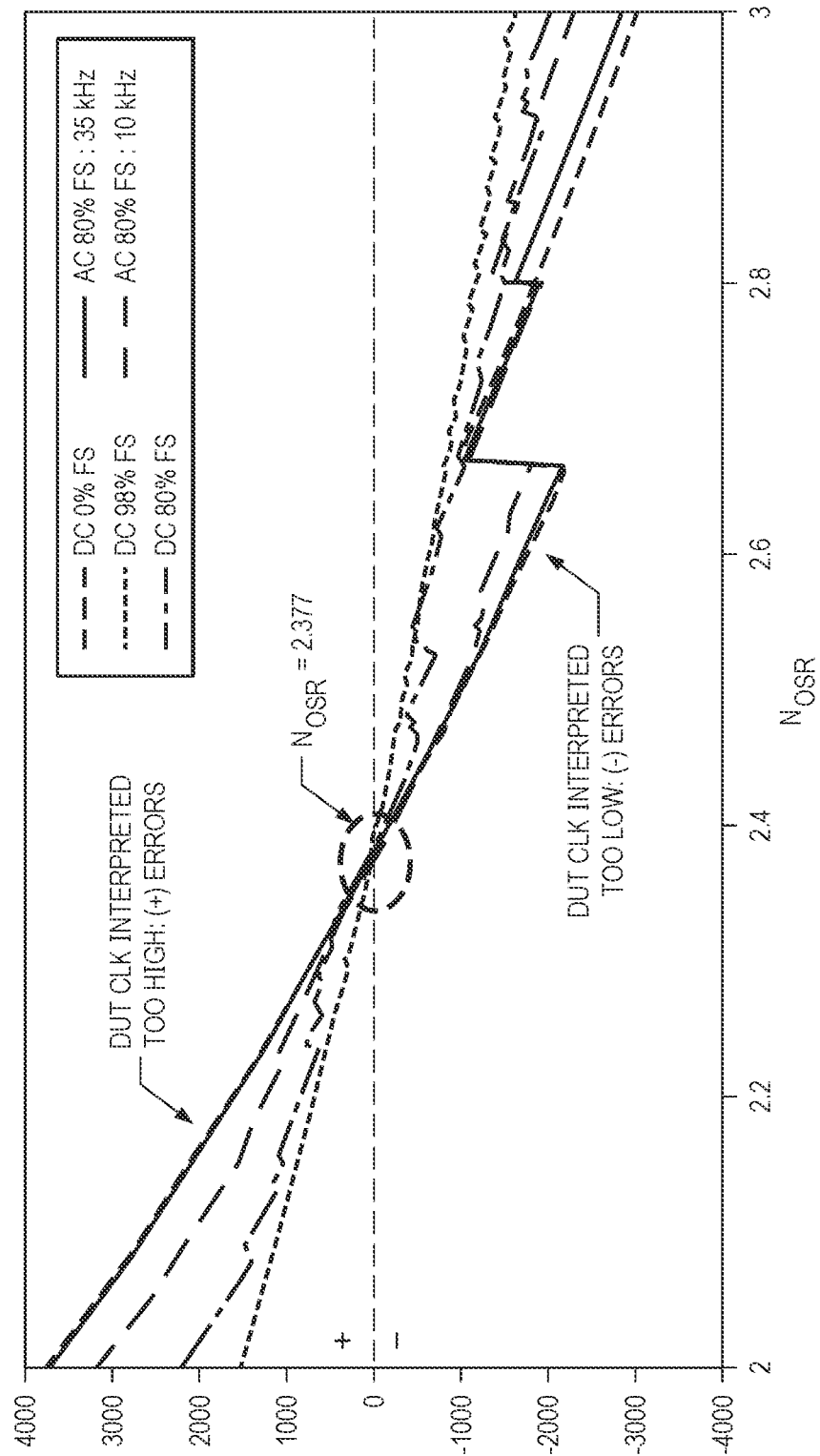
FIG. 11 is a graph illustrating accumulated interpreted error as positive or negative bit errors for various oversampling factors according to one example.

If the estimated DUT clock rate was interpreted too high, positive accumulated bit errors (that is, extra bits such as an extra "0" or an extra "1") will occur in the recovered bitstream; and if the estimated DUT clock rate was interpreted too low, negative accumulated bit errors (that is, fewer bits) will occur in the recovered bitstream. This can be seen, for example, in the graph of FIG. 11. As can be seen in the graph 1100, the varied $N_{OSR}$ runs along the x-axis between the values of 2.0 and 3.0 in this example, while the accumulated interpreted error runs along the y-axis. As shown, for adjusted $N_{OSR}$ values less than 2.377, in this example, positive accumulated bit errors will occur in the recovered bitstream, while for adjusted $N_{OSR}$ values greater than 2.377 in this example, negative accumulated bit errors will occur. Using the minimization function and the calculated widths in the data set from the digital bitstream, an $N_{OSR}$ is learned or calculated that accurately reflects the actual clock frequency of the DUT clock (i.e., the ADC clock). It should be understood that while FIG. 11 shows how satisfaction of the minimization function operates to identify the learned $N_{OSR}$ for the example bitstream 904 in FIG. 9, the process operates similarly on different ADC input voltages that result in different non-encoded digital bitstreams input to the control circuitry 808 of FIG. 8, for example. Thus, the methodology set forth in FIG. 10 will operate to identify a learned $N_{OSR}$ for any non-encoded digital bitstream that reflects accurately the actual clock rate of the circuitry that generated the non-encoded digital bitstream.

The graph in FIG. 11 illustrates multiple curves, where each curve represents different analog input signals. Every ADC has a reference voltage, a voltage that is considered to be the maximum measurable voltage for that ADC design. The ADC can measure analog input voltages and generate an accurate digital representation of that analog voltage within this reference voltage limit, while analog input voltages beyond this reference voltage value will "clip" the ADC, and in such cases the ADC will not provide accurate digital information at its output. To be generic, this maximum reference voltage limit is called the FullScale voltage or FS. The % FS is a way to relate how close the input voltage at the ADC is to the maximum measurable voltage. ADCs with a single-ended architecture can measure and convert analog input voltages from 0V to +FS, while ADCs with a bipolar architecture can measure and convert voltages from +FS to −FS.

The five (5) curves shown in FIG. 11 indicate the response of the minimization function on five (5) different delta-sigma ADC bitstream patterns, and thus five (5) different analog input voltage patterns. The term "DC 0% FS" means the ADC analog input voltage is a static DC signal at 0% FS, also known as 0Vdc, or sometimes referred to as the offset voltage. As an artifact of the delta-sigma ADC modulator architecture, the resulting digital bitstream has its highest bit transition density at this point, meaning the most bit transitions are occurring in the resultant digital output bitstream compared to the outputs bitstreams associated with other analog test input voltage signals. For example, at DC 0% FS, the resultant digital bitstream has bit transitions every 1-4 bits (e.g., a b0 to a b1, or vice-versa). In contrast, the DC 98% FS means the analog input voltage is a DC signal at 98% FS, which is typically considered the maximum usable range before the ADC "clips" the input signal at 100% FS. At this condition (DC 98% FS), the resultant bitstream density (e.g., the frequency of bit transitions in the output bitstream) is comprised of 128 b1's followed by 1 b0. While not shown as an example in FIG. 11, a "DC −98% FS" input would result in a digital bitstream having the opposite output digital bitstream pattern, that is, 128 b0s followed by 1 b1. A "DC 80% FS" has an intermediate resultant bitstream bit transition density of approximately 16 b1's followed by 1 b0. In contrast to a static analog input signal is a varying analog input signal, for example, an "AC 80% FS: 35 Hz" and an "AC 80% FS: 10 kHz," wherein each are an analog input sine-wave signal at 80% FS peak-peak amplitude, at 35 kHz and 10 kHz respectively. As expected by the delta-sigma ADC architecture, these two sine-wave analog input signals vary the bitstream bit transition density at the ADC output corresponding to the input voltage at that moment, meaning that the resultant bitstream density is itself dynamic. The reason for illustrating these 5 different test signals in FIG. 11 is to show that no matter what type of analog input voltage the ADC is measuring (e.g., DC/AC, small/large amplitude), the minimization function will return the same correct value for $N_{OSR}$.

Referring back to FIG. 10, the method 1000 continues at 1010 by calculating and inserting the data bits of the bitstream using the calculated widths and the learned oversampling factor $N_{OSR}$ that best satisfies the minimization function from step 1008. In one example, the calculation of the bits for insertion to the digital filter digestion is calculated according to:

$$\text{Bits}_{Insert} = RND\left(\frac{\text{width}}{N_{OSR}}\right)$$

This can be better understood referring back to FIG. 9 and the calculation boxes 910 below the oversampled clock signal 906. Graph 900 is based on a nominal $N_{OSR}$ of 3. Because of this value, the calculated widths for the initial "1" is 3, so RND (3/3) would be a width of 1 for the digital value "1", or 1 b1 (b1 representing a digital value of "1"). The second width (for a digital value "0") is 6 cycles long, so a calculation RND (6/3) is a width of 2 for the digital value "0", or 2 b0 (b0 representing a digital value of "0"). The next value of "1" is 5 cycles long, so RND (5/3)=RND (1.67)=2, or 2 b1 (thus this digital value of "1" of 5 cycles long is assigned a width of 2). The next value of "0" is 3 cycles long, so RND (3/3)=1 b1. Lastly, as illustrated in FIG. 9, the last shown digital value of "0" is 9 cycles long, and thus RND (9/3)=3, and thus the result is 3 b0. As stated above, FIG. 9 does not show an example with the learned $N_{OSR}$, but instead shows an example with the nominal $N_{OSR}$ of 3 for ease of illustration. However, after calculating the learned $N_{OSR}$ in a manner consistent with the above example that best satisfies the minimization function, a "learned" value can be obtained. That is, with a "learned" or calculated oversampling factor $N_{OSR}$ of 2.377, for a width of 3, the calculated inserted bits for the first "1" in FIG. 9 would instead be RND (3/2.377), which results in 1 b1. Similar calculations are conducted for each of the remaining calculated widths for the entire digital bitstream.

Consequently, using the learned oversampling factor from step 1008 in the bit insertion step of 1010 allows for the accurate recovery of the data bitstream from the ADC without needing to receive the ADC clock for synchronizing purposes. Using the asynchronous oversampling and learning technique disclosed herein, an accurate recovery of the bitstream from one or more ADCs is available without the extra pins and transmission paths needed when employing the ADC clock as in conventional solutions.

The impact of employing the correct oversampling factor in the digital filter digestion process is illustrated in FIGS. 12-14. In FIG. 12, an $N_{OSR}$ of 2.25 is employed, resulting in undesired positive accumulated bit errors. While the upper, analog graph 1200 of the reconstructed analog signal 1210 does not show significant issues at the illustrated resolution, the lower graph 1220 (showing the frequency spectrum of the signal following a Fast Fourier Transform, FFT) shows a modest amount of excess noise and distortion at higher frequencies, as highlighted in the dashed zone 1230. Similarly, FIG. 13 shows graphs 1300, including a time-domain analog graph 1310 of the resultant recovered bitstream using an $N_{OSR}$ of 2.45. This value interprets the DUT clock (of the ADC) too low and results in negative bit errors. These bit errors, similar to that in FIG. 12, are not readily seen in the time domain graph 1310, but become more apparent in the frequency domain graph 1320. As shown, the highlighted elliptical zone 1330 shows a modest amount of excess noise and distortion at higher frequencies. In stark contrast, FIG. 14 shows graphs 1400 of the recovered bitstream using the learned $N_{OSR}$ which, in this example, was 2.377 (see the example in FIG. 11), and satisfied the minimization function for the measured widths of the bitstream. As can be seen in the frequency domain graph 1420, substantially no distortion is found in the frequency spectrum, as highlighted in the zone 1430, indicating no bit errors in the recovered bitstream. This result is as would be expected, and is identical in performance to conventional recovery methods, but without the need for communicating the ADC clock information as was required in the conventional solutions.

The method of FIG. 10 is a generic solution that will work under any circumstances, but relies on a relatively high-powered processor that performs floating-point calculations. In some situations where a knowledge of the DUT clock frequency (e.g., an ADC clock frequency) and the sampling clock frequency are known with a reasonable accuracy (as explained in greater detail below), a simplified system such as a field programmable gate array (FPGA) implementation solution may be employed and is contemplated as falling within the scope of the present disclosure. Under such circumstances, the non-encoded digital bitstream is oversampled using a Y-bit-width counter, and $N_{OSR}$ is not varied, but rather is fixed at a value of $2^Y$, wherein Y≥2. For an example, if Y=2, then $N_{OSR}$=4, and the oversampling is performed with a 2-bit counter. Thus, the counter counts as follows: 0, 1, 2, 3, 0, 1, 2, 3, . . . .

In one non-limiting example, what constitutes a "reasonable" accuracy between the asynchronous clocks may be established as follows:

$$\text{Clock Error Ratio:: } \left(\left(\frac{DUT_{CLK}}{\frac{\text{Sample}_{CLK}}{N_{OSR}}}\right)-1\right) < \left(\frac{\pm 0.5}{\text{Bits}_{Insert\_Ideal}}\right)$$

The accuracy requirements with regard to the acceptable clock error ratio may be modified slightly based on a number of bitstream bits without a transition. For example, the left side of equation is the error ratio of DUT_CLK (to interpreted DUT_CLK); and the right side of equation is ½ bit (for rounding) divided by the number of bits without a transition.

At DC 0% FullScale input (0Vdc input), the modulator bitstream transitions most often compared to other typical analog test input signals, resulting in a bit transition density of a bit transition every 1-4 bits, allowing for a modest amount of error, for example, ~12.5% error according to the clock error ratio equation above. Therefore, in the case of DC 0% FS, an error in DUT clock accuracy (with respect to the sampling clock frequency estimate) of as much as 12.5% can be entertained. With a DC 98% FullScale input (e.g., the practical tested maximum analog input signal voltage range for most ADCs), this is ~128 bits without a transition (e.g., a lower bit transition density than the DC 0% FS), a much tighter tolerance in DUT clock accuracy of 0.391% is needed (or ~391 ppm), as seen from the right side of the above clock error ratio equation, where 0.5/128=0.003906, which is 0.391%.

Using a similar type of analysis, 80% FS is composed of 16 bits without a transition, and a recommended ratio of accuracy of the DUT clock frequency and the sampling clock frequency is within 3.125%. At 100% FullScale the ADC is fully clipped and provides no useful voltage information, and there may be an infinite number of codes without a transition, this is out of the usable range, and not considered as a supported case. From the above, it can be seen that the simplified methodology explained in detail below may be employed when the asynchronous clocks are reasonably accurate as defined above.

It should be noted that a user can make use of the simplified algorithm discussed below when the device (e.g., DUT or ADC) and host (e.g., controller) clock domains remain within the recommended clock error ratio for the intended voltage measurement range (e.g., within 391 ppm if using up to 98% FS input range). If the clock domains are no longer reasonably well understood (e.g., clock drift due to time/temperature/voltage/stress/etc.), then the error ratio is at risk of being exceeded. In such case it is recommended that the simplified methodology discussed below be abandoned, and the user should instead perform the $N_{OSR}$ learning step discussed prior using the minimization function, as otherwise the bitstream interpretation may be incorrect.

In the simplified example, an overflow of the counter (i.e., the counter reaching the end of its count, in this case 3, and rolling back over to its initial count value of zero) triggers another bit for insertion for the digital filter digestion. That is, if a digital value of "1" of the bitstream exists for longer than four counts of the 2-bit counter, the overflow of the counter triggers an insertion of a "1" for that bit, and a beginning of counting of a "1" for the next bit, at least potentially. If during the counting of the next bit (and before an overflow of the counter) the bitstream transitions from the value "1" to a "0", then a rounding function is employed to ascertain whether a next bit of value "1" is to be inserted. This rounding function is performed, in one embodiment, by evaluating the most significant bit (MSB) of the value (MSB) (that is, the Y−1 bit position) and using its value as a trigger for inserting another bit. In such an instance, if the MSB="1", you insert another bit of the previous value (in this case, another "1" bit). If, however, the MSB=:"0", no further bit is inserted. As the value of the bitstream has transitioned to the value "0" a counting of the width of such value proceeds, and so on.

A pseudo code 1500 (in VERILOG) for this process is shown in FIG. 15. Step 1510 is an evaluation of the present sample of the non-encoded digital bitstream, as well as a comparison of a next sample value to the previous sample value (i.e., whether Dout_n2=Dout_n1). At step 1520, if the subsequent sample value is the same as the previous sample value, no state transition of the bitstream has occurred, and a subroutine at step 1530 is initiated. At step 1530, the comparison continues, and if the state value has not changed for each sample, and the Y-bit counter has overflowed (that is, reached a count of 3, and is returning to a count of 0), the overflow serves as a trigger to insert a bit into the digital filter. Thus, if the digital bitstream is at a value of "1" when the counter reaches its overflow, a "1" bit is inserted into the digital filter and the counter keeps counting, starting from a count of 0.

Still referring to FIG. 15, if the next sample has changed state (i.e., Dout_n2≠Dout_n1), then the bitstream has transitioned from a value of "1" to a value of "0", and the pseudo code 1500 jumps to the subroutine 1540. At step 1540, a decision is made whether another value "1" will be inserted to the digital filter based on a rounding function. This is done by looking at the MSB of the counter count. Since the counter in this example is a 2-bit counter (i.e., Y=2), the counter counts are: 00, 01, 10, 11. If the MSB is a "1" at the count where the transition occurred, a round up operation is performed and another "1" (which in this example is the previous state of the bitstream) is inserted to the digital filter, and if the MSB=0 where the transition occurred, then a rounding down occurs, no bit is inserted to the digital filter, and the counter is reset. The counter then begins its count of the next state of the digital bitstream, which is now a state "0". The process then continues in this fashion.

Figure 16:
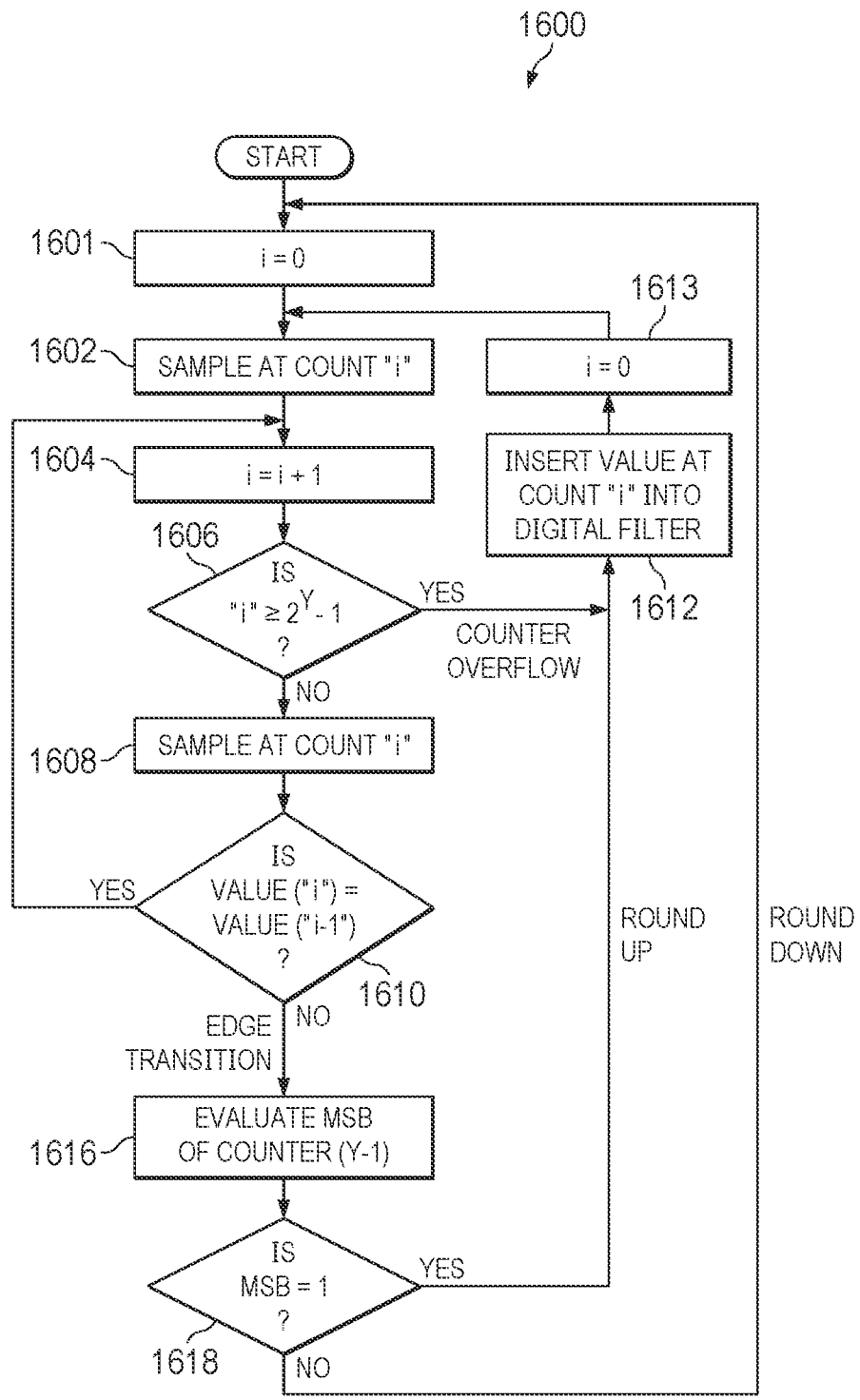
FIG. 16 is a flow chart diagram illustrating a method of recovering data from a non-encoded digital bitstream received from an ADC according to one example.

Another way of considering the method is illustrated in the flow chart 1600 of FIG. 16. Using the oversampling clock value $N_{OSR}=2^Y$, with "Y" being an integer greater than 1, the received non-encoded digital bitstream is sampled. For an example of Y=2, $N_{OSR}$=4, and thus for an ADC or DUT clock rate of 10 MHz, the oversampling clock will be 40 MHz, using a Y-bit (i.e., a 2-bit) counter. Thus, the Y-bit-width counter will overflow every four (4) counts or samples.

At step 1601, a counter begins at i=0, wherein the 2-bit counter cycles along the counts of 0, 1, 2, 3 as 2-t value 00, 01, 10 and 11, respectively. At step 1602, the non-encoded digital bitstream is sampled at count "i", for example i=0 (i.e., 00 count state of the 2-bit counter), and such sample value in this example is a digital value "1" as a first digital value. The count of the counter is then incremented at step 1604 to the next count of 1 (i.e., 01 count state of the 2-bit counter). A query is made whether the counter has reached an overflow state at step 1606 by seeing if the present count (i.e., 1) of the counter is greater than $2^Y-1$ (i.e., 3). In this case, the answer is NO at step 1606 and the method 1600 proceeds to step 1608, wherein the counter samples at count 1, and a query is then made at step 1610 whether the value of the bitstream at count 1 is the same as the value of the bitstream at count 0. If YES at step 1610, no edge transition has occurred, and the method 1600 returns to step 1604, wherein the counter is incremented to the next count of 2. As the counter has still not overflowed at step 1606, the counter samples the bitstream again at step 1608 and checks to see if the sample value has changed from the previous sample at step 1610. If the value is still at "1" (YES at step 1610), the method 1600 again returns to step 1604 and repeats the process. However, at step 1606, once the counter has overflowed (YES at step 1606 when the counter reach a count state of 3 which is the 2-bit count of 11), and this overflow is used as a trigger to insert the bit of digital bitstream bit value "1" into the digital filter at step 1612. The counter is reset at step 1614 automatically in that it rolls over and the count begins at a count of 0 (i.e., 00). The bitstream then continues to be sampled as discussed above.

At step 1610, when the value of a present sample of the digital bitstream is different from the value of a previous sample (NO at step 1610), an edge transition of the digital bitstream has occurred (e.g., the value has transitioned from a "1" to a "0", or more generically, from a first digital value to a second, different digital value. In this case, a decision must be made whether "enough" of the previous bitstream state was present during the counting of the 2-bit counter to insert a bit of that value of the bitstream into the digital filter, or whether to forego any bit insertion. In one example, this is done by evaluating a most significant bit (or more generally speaking, evaluating the Y−1 bit) of the counter count where the transition occurred. Thus, if the MSB=1, then the counter count where the transition was detected is either the 2-bit count "10" (a count of 2) or the 2-bit count "11" (a count of 3), and a round up function is performed (YES at step 1618), and a bit is inserted into the digital filter (i.e., a value "1" as this value was the digital value of the bitstream being sampled. If MSB=0 (NO at step 1618), then the edge transition from "1" to "0" occurred during either the "0" counter count (i.e., 00) or the "1" counter count (i.e., 01) of the 2-bit counter. As the edge transition is deemed to have occurred early within the counting of the counter through its various count states, no bit insertion occurs and the counter is reset back to an initial count of 0 (i.e., 00) at step 1601, and sampling of the new state (in this case, a second digital value of "0") occurs at step 1602. The method 1600 then continues for all the states of the received non-encoded digital bitstream.

One advantage of the method 1600 of FIG. 16 (similarly or analogously illustrated in FIG. 15), is that the bit insertion is decided on-the-fly, meaning that the widths of the various states of the bitstream are not measured and saved, but instead are monitored as received and decisions are made to insert a bit to the digital filter as the bitstream is received. Thus measuring widths, saving such data in a memory, and subsequently retrieving such data and then inserting various bits to a digital filter is unnecessary, and any latency associated therewith is avoided.

As described above, the present description relates to a circuit and method of recovering an ADC bitstream using a single wire solution with asynchronous oversampling.

The methods are illustrated and described above as a series of steps or events, but the illustrated ordering of such steps or events is not limiting. For example, some steps or events may occur in different orders and/or concurrently with other steps or events apart from those illustrated and/or described herein. Also, some illustrated steps or events are optional to implement one or more aspects or embodiments of this description. Further, one or more of the steps or events depicted herein may be performed in one or more separate steps and/or phases. In some embodiments, the methods described above may be implemented in a computer readable medium using instructions stored in a memory.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other implementations are possible, within the scope of the claims.

What is claimed is:

1. A method for recovering data from a digital bitstream, comprising:
    asynchronously oversampling the digital bitstream;
    calculating widths of bits of the digital bitstream, wherein the widths of the bits correspond to a number of cycles of the asynchronous oversampling rate of the bits as "0s" and "1s" of the received digital bitstream;
    calculating a learned oversampling factor using the calculated widths number of bits of the digital bitstream and a minimization function; and
    calculating data bits using the calculated widths of the bits of the digital bitstream and the learned oversampling factor.

2. The method of claim 1, wherein the nominal oversampling factor is greater than 2.

3. The method of claim 1, a oversampling rate is based on a clock rate of an analog-to-digital converter that provided the digital bitstream.

4. The method of claim 1, wherein calculating widths of the digital bitstream comprises:
    counting a number of cycles of the nominal oversampling clock associated with each "1" and each "0" of the digital bitstream;
    dividing the count representing the number of cycles for each bit of the digital bitstream by a number representative of the nominal oversampling factor to obtain a quotient associated with each bit of the digital bitstream; and rounding the resultant quotient associated with each bit value of the digital bitstream to an integer value.

5. The method of claim 4, wherein rounding the resultant quotient comprises rounding the resultant quotient up to a next integer value when a fractional portion of the resultant quotient is greater than or equal to 0.5.

6. The method of claim 1, wherein the minimization function is:

$$0 = \sum_{i=0}^{1000}\left(\frac{\left(\frac{\text{width}[i]}{N_{OSR}}\right)}{RND\left(\frac{\text{width}[i]}{N_{OSR}}\right)} - 1\right)$$

wherein width[i] comprises the calculated width of the $i^{th}$ bit of the predetermined number of bits, wherein the predetermined number of bits is 1000, wherein $N_{OSR}$ is the learned oversampling factor of a plurality of oversampling factors varied over a predetermined range of values that satisfies the minimization function, and wherein RND comprises a rounding operator.

7. The method of claim 6, wherein the oversampling factor is varied over the predetermined range of values that comprises: $2 < N_{OSR} < 3$.

8. The method of claim 1, wherein the sampling rate of the asynchronous oversampling comprises a product of a specification of a clock rate of the analog to digital circuitry and a nominal oversampling factor.

9. A controller circuit, comprising:
a memory circuit; and
control circuitry coupled to the memory circuit, wherein the control circuitry is configured to:
asynchronously oversample a non-encoded digital bitstream at a sampling rate relating to an estimate of a clock rate of circuitry that generated the non-encoded digital bitstream;
calculate widths of bits of the non-encoded digital bitstream, wherein the widths of the bits correspond to a number of cycles of the sampling rate of the asynchronous oversampling of the bits as "0s" and "1s" of the non-encoded digital bitstream, and save the calculated widths in the memory circuit;
calculate a learned oversampling factor by accessing and using the calculated widths of a predetermined number of bits of the digital bitstream from the memory circuit and a minimization function, and save the calculated learned oversampling factor in the memory circuit; and
calculate data bits to be inserted to a digital filter by accessing and using the calculated widths of the bits of the digital bitstream from the memory circuit and the learned oversampling factor.

10. The controller circuit of claim 9, wherein the circuitry that generated the non-encoded digital bitstream is an analog to digital converter.

11. The controller circuit of claim 9, wherein the estimate of the clock rate of the circuitry that generated the non-encoded digital bitstream is based on a specification associated with the circuitry that generated the non-encoded digital bitstream.

12. The controller circuit of claim 9, wherein the control circuitry that is configured to calculate widths of the non-encoded digital bitstream is further configured to:
count a number of cycles of the nominal oversampling clock associated with each "1" bit and each "0" bit of the received non-encoded digital bitstream and save the count for each bit in the memory circuit;
retrieve the count from the memory circuit and divide the count representing the number of cycles for each bit of the non-encoded digital bitstream by a number representative of the nominal oversampling factor to obtain a quotient associated with each bit of the non-encoded digital bitstream; and
round the resultant quotient associated with each bit of the received non-encoded digital bitstream to an integer value.

13. The controller circuit of claim 12, wherein the control circuitry is configured to round the resultant quotient by rounding the resultant quotient up to a next integer value when a fractional portion of the resultant quotient is greater than or equal to 0.5.

14. The controller circuit of claim 9, wherein the minimization function is:

$$0 = \sum_{i=0}^{1000}\left(\frac{\left(\frac{\text{width}[i]}{N_{OSR}}\right)}{RND\left(\frac{\text{width}[i]}{N_{OSR}}\right)} - 1\right)$$

wherein width[i] comprises the calculated width of the $i^{th}$ bit of the predetermined number of bits, wherein the predetermined number of bits is 1000, wherein $N_{OSR}$ is the learned oversampling factor of a plurality of oversampling factors varied over a predetermined range of values that satisfies the minimization function, and wherein RND comprises a rounding operator.

15. The controller circuit of claim 9, wherein the oversampling factor is varied over the predetermined range of values that comprises: $2 < N_{OSR} < 3$.

16. The controller circuit of claim 9, wherein the sampling rate of the asynchronous oversampling comprises a product of a specification of a clock rate of the circuitry that generated the non-encoded digital bitstream and a nominal oversampling factor.

17. A method for recovering data from a digital bitstream, comprising:
asynchronously oversampling the digital bitstream at a sampling rate $2^Y$ using a Y-bit-width counter, wherein Y is an integer greater than 1;
comparing a value of a sample at a count "i" of the Y-bit-width counter to a value of a sample at a previous count "i−1" of the Y-bit-width counter;
continuing an oversampling of the digital bitstream with the Y-bit-width counter when the value of the digital bitstream at the count "i" is the same as the value of the digital bitstream at the count "i−1" and continuing the comparing if the sample value condition continues to be the same until the Y-bit-width counter overflows, and inserting a bit having the value as a first digital value to a digital filter;
evaluating a most significant bit (MSB) of the Y-bit-width counter count when the value of the digital bitstream at the count "i" is not the same as the value of the digital bitstream at the count "i−1", thereby indicating a transition in state of the received digital bitstream to a second digital value; and inserting a bit having the value as the first digital value to a digital filter when the MSB of the Y-bit-width counter count is a value of "1" indicating a rounding up of the rounding function, and performing no bit insertion when the MSB is a value of "0" indicating a rounding down of the rounding function.

18. The method of claim 17, further comprising resetting the Y-bit-width counter upon inserting the bit to the digital filter.

19. The method of claim 17, wherein Y=2.

20. The method of claim 17, further comprising, upon indicating the transition in state of the digital bitstream to the second digital value:

resetting the Y-bit-width counter;

continue asynchronously oversampling the digital bitstream at the sampling rate $2^Y$ using the Y-bit-width counter;

comparing a value of a sample at a count "i" of the Y-bit-width counter to a value of a sample at a previous count "i−1" of the Y-bit-width counter;

continuing an oversampling of the digital bitstream with the Y-bit-width counter when the value of the digital bitstream at the count "i" is the same as the value of the digital bitstream at the count "i−1" and continuing the comparing if the sample value condition continues to be the same until the Y-bit-width counter overflows, and inserting a bit having the value as the second digital value to the digital filter;

evaluating the MSB of the Y-bit-width counter count when the value of the digital bitstream at the count "i" is not the same as the value of the digital bitstream at the count "i−1", thereby indicating a transition in state of the digital bitstream to the first digital value; and inserting a bit having the value as the second digital value to a digital filter when the MSB of the Y-bit-width counter count is a value of "1" indicating a rounding up of the rounding function, and performing no bit insertion when the MSB is a value of "0" indicating a rounding down of the rounding function.

* * * * *